United States Patent
Kogasaka et al.

(10) Patent No.: US 6,707,687 B2
(45) Date of Patent: Mar. 16, 2004

(54) CONNECTION STRUCTURE FOR RADIO FREQUENCY CIRCUIT THAT EXCEEDS IN RF CHARACTERISTICS

(75) Inventors: Yoshinori Kogasaka, Fukushima-ken (JP); Satoru Matsuzaki, Fukushima-ken (JP); Keiichiro Sato, Fukushima-ken (JP); Shuji Saito, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/446,326

(22) Filed: May 27, 2003

(65) Prior Publication Data
US 2003/0223206 A1 Dec. 4, 2003

(30) Foreign Application Priority Data

May 29, 2002 (JP) ........................... 2002-155871
Jul. 30, 2002 (JP) ........................... 2002-221839

(51) Int. Cl.[7] ................................................ H05K 9/00
(52) U.S. Cl. ...................... 361/800; 361/816; 361/818; 174/35 R; 174/35 GC
(58) Field of Search ................... 361/800, 816, 361/818; 174/35 R, 35 GC, 35 MS; 343/841; 334/85; 307/91; 330/68; 331/67

(56) References Cited

U.S. PATENT DOCUMENTS

| | | | | |
|---|---|---|---|---|
| 5,297,007 A | * | 3/1994 | Deyo et al. | 361/707 |
| 5,635,754 A | * | 6/1997 | Strobel et al. | 257/659 |
| 5,763,824 A | * | 6/1998 | King et al. | 174/35 R |
| 6,462,960 B1 | * | 10/2002 | Watanabe | 361/816 |
| 6,485,595 B1 | * | 11/2002 | Yenni et al. | 156/221 |

FOREIGN PATENT DOCUMENTS

JP  07-240576  9/1995

* cited by examiner

*Primary Examiner*—David Martin
*Assistant Examiner*—Dameon E Levi
(74) *Attorney, Agent, or Firm*—Brinks Hofer Gilson & Lione

(57) ABSTRACT

In a connection structure of a radio frequency circuit of the invention, a jumper line of a jumper member is positioned by an insulating base, and the jumper line has a base part that is located inside a cover to be electrically shielded and terminals that are protruded downward from a lower side of the insulating base. In a state that the jumper line of the jumper member intersects a third conductor, the terminals are inserted through a circuit board to be connected to first and second conductors. Therefore, the base part of the jumper line is electrically shielded by the cover, which achieves satisfactory RF characteristics.

7 Claims, 6 Drawing Sheets

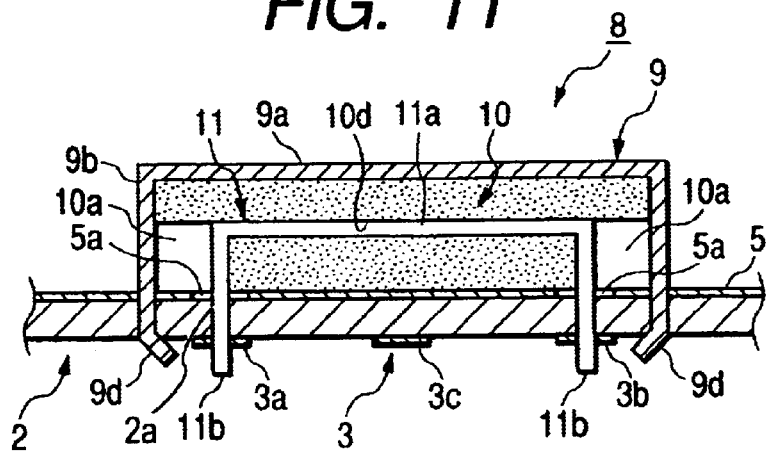
FIG. 11
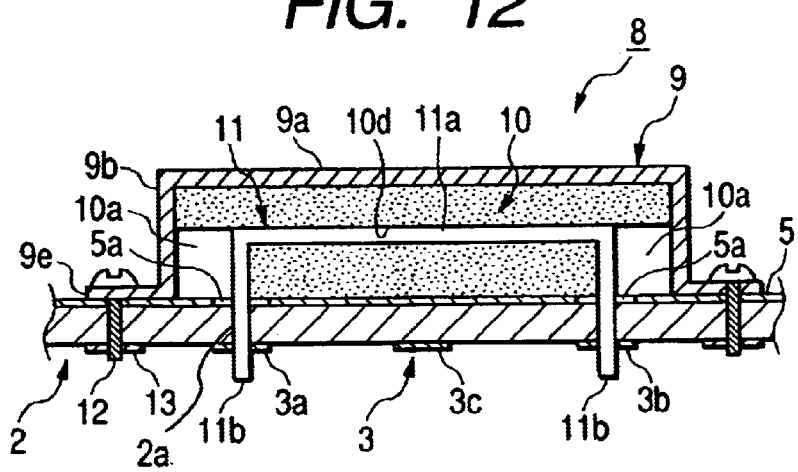
FIG. 12
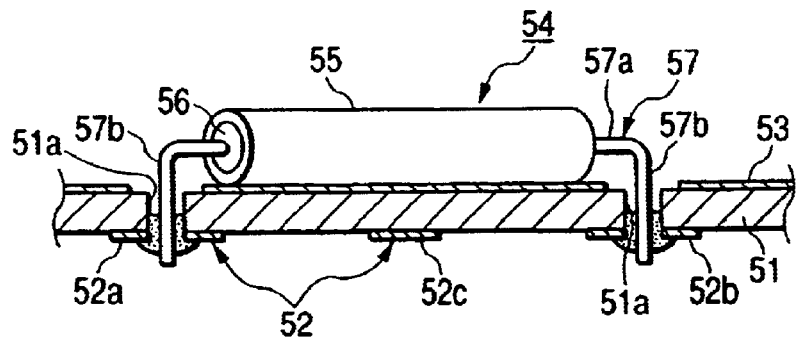
FIG. 13 PROR ART

CONNECTION STRUCTURE FOR RADIO FREQUENCY CIRCUIT THAT EXCEEDS IN RF CHARACTERISTICS

BACKGROUND OF THE INVENTION

1. Field of the Invention

The present invention relates to a connection structure for a radio frequency circuit, which is suitable for use in receiving converters for satellite broadcasting and the like.

2. Description of the Related Art

A conventional connection structure for a radio frequency circuit will be described with reference to FIG. 13 (hereunder, radio frequency is abbreviated as RF). A printed circuit board 51 is provided with a wiring pattern 52 on one side, and the wiring pattern 52 mounts various electric components (not illustrated) to form a desired RF circuit.

The wiring pattern 52 includes first and second conductors 52a, 52b that are located with a space in between, and a third conductor 52c that passes between the first and second conductors 52a, 52b.

A grounding pattern 53 for shielding is provided on all the other side of the circuit board 51, which is not illustrated here. The circuit board 51 thus constructed is attached to a frame, in such a manner that the electric components are located inside the frame, and the grounding pattern 53 is exposed outside the frame. The grounding pattern 53 together with the frame plays a role of shielding the electric components.

A jumper member 54 is made up with a pipe-formed shield 55 made of phosphor copper, an insulator 56 molded inside the shield 55, and a jumper line 57 buried in the center of the insulator 56.

The jumper line 57 has a straight base part 57a, and a pair of terminals 57b bent at a right angle to the base part 57a from both ends thereof, thus forming a U-shaped structure. The center of the base part 57a is retained by the insulator 56, and is shielded by the shield 55. Both the ends of the base part 57a and the terminals 57b are exposed from the shield 55.

The jumper member 54 is placed on the side of the grounding pattern 53 of the circuit board 51, which is exposed outside, and the shield 55 is soldered on the grounding pattern 53.

The pair of terminals 57b of the jumper line 57 are inserted through holes 51a of the circuit board 51, and are each soldered to the first and second conductors 52a and 52b. Thus, the jumper line 57 is connected to the first and second conductors 52a, 52b so as to intersect the third conductor 52c.

In the jumper member 54 used in the conventional connection structure for an RF circuit, since the insulator 56 and the jumper line 57 are molded in the shield 55, the production cost becomes expensive, and this is a problem to be solved.

Further, both the ends of the base part 57a and the terminals 57b are exposed outside the shield 55, and when the jumper member 54 is mounted on the circuit board 51, both the ends of the base part 57a and the terminals 57b are exposed from the grounding pattern 53, which deteriorates the RF characteristics.

SUMMARY OF THE INVENTION

Accordingly, it is an object of the present invention to provide a connection structure for an RF circuit that exceeds in the RF characteristics at a low cost.

According to one aspect of the invention, the connection structure for an RF circuit is provided with a circuit board that mounts electric components on a wiring pattern provided on one side thereof to form a desired RF circuit, a grounding pattern provided on another side of the circuit board, and a jumper member provided on the other side of the circuit board. The jumper member is made up with a boxed-shaped cover with a lower side open, an insulating base contained inside the cover, and a jumper line of which both ends are projected downward from a lower side of the insulating base in a state that the jumper line is positioned by the insulating base. The jumper line has a base part that is positioned by the insulating base, and is placed inside the cover to be electrically shielded, and terminals projected downward from the lower side of insulating base. The wiring pattern includes first and second conductors and a third conductor that passes between the first and second conductors. As to the jumper member provided on the other side of the circuit board, the insulating base having positioned the jumper line is mounted on the circuit board. The terminals are inserted through the circuit board to be connected to the first and second conductors in a state that the jumper line intersects the third conductor. And, the cover is attached to the circuit board in a state that the lower ends of cover are put into contact with the grounding pattern.

According to another aspect of the invention, a whole circumference of the cover is soldered to the grounding pattern.

According to another aspect of the invention, the jumper line has a straight base part and a pair of terminals that are bent from both ends of the base part. The insulating base has a longitudinal through hole, and the base part is inserted through the through hole, whereby the jumper line is positioned and retained.

According to another aspect of the invention, the jumper line has a straight base part and a pair of terminals that are bent from both ends of the base part. The base part is placed in a groove provided on an upper part of the insulating base, whereby the jumper line is positioned.

According to another aspect of the invention, the jumper line has a straight base part and a pair of terminals that are bent from both ends of the base part. The terminals are inserted through vertical holes provided on the insulating base, whereby the jumper line is positioned and retained.

According to another aspect of the invention, the circuit board is attached to an open part provided to one side of a frame, the electric components are located inside the frame, and the grounding pattern and the jumper member are exposed outside the frame.

According to another aspect of the invention, a feeder horn is attached to the grounding pattern to be located outside the frame to form a receiving converter for satellite broadcasting.

BRIEF DESCRIPTION OF THE DRAWINGS

FIG. 11 is an enlarged sectional view illustrating a major part of the connection structure for an RF circuit of the fifth embodiment;

FIG. 12 is an enlarged sectional view illustrating a major part of the connection structure for an RF circuit of the sixth embodiment; and FIG. 13 is a sectional view illustrating a major part of the conventional connection structure for an RF circuit.

DETAILED DESCRIPTION OF THE PREFERRED EMBODIMENTS

Figure 1:
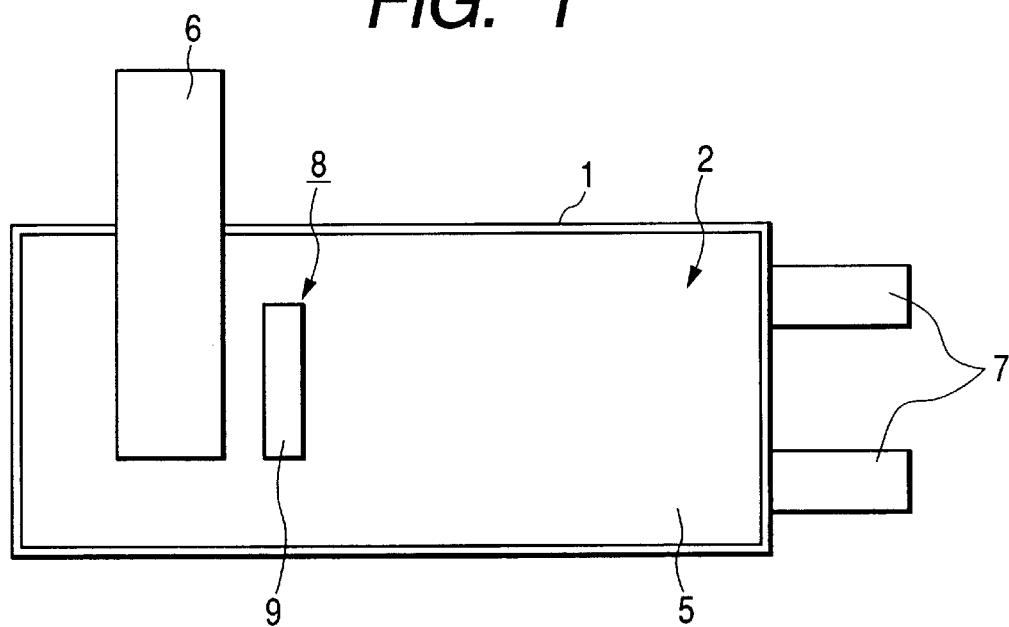
FIG. 1 is a plan view illustrating the connection structure for an RF circuit of the first embodiment according to the invention.
Figure 2:
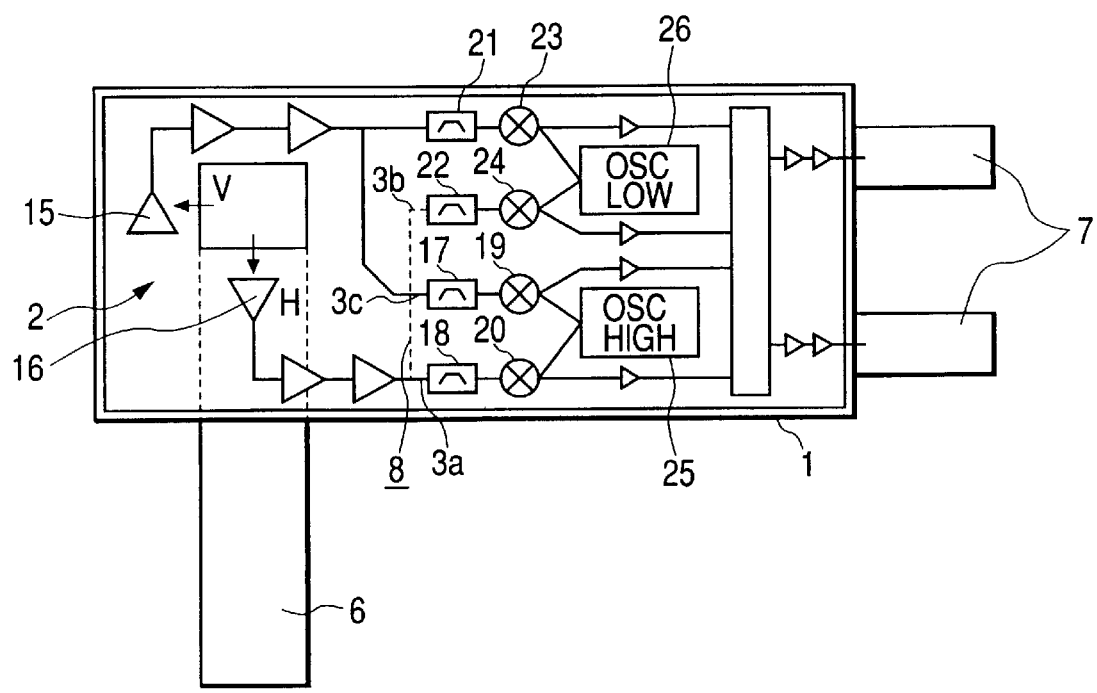
FIG. 2 is a bottom view briefly illustrating the RF circuit of the first embodiment according to the invention.
Figure 3:
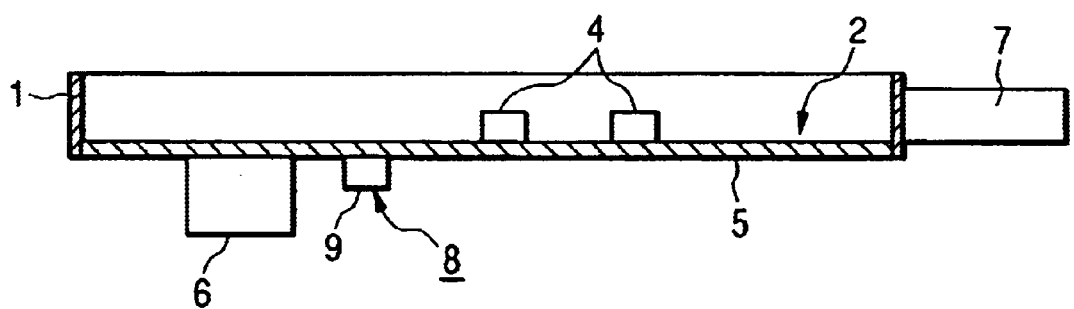
FIG. 3 is a sectional view illustrating the connection structure for an RF circuit of the first embodiment.

The drawings of the connection structure for an RF circuit of the preferred embodiments will be explained; FIG. 1 is a plan view for the connection structure of the first embodiment; FIG. 2, a bottom view illustrating an outline of the RF circuit, relating to the first embodiment; and FIG. 3, a sectional view illustrating the connection structure of the first embodiment.

Figure 4:
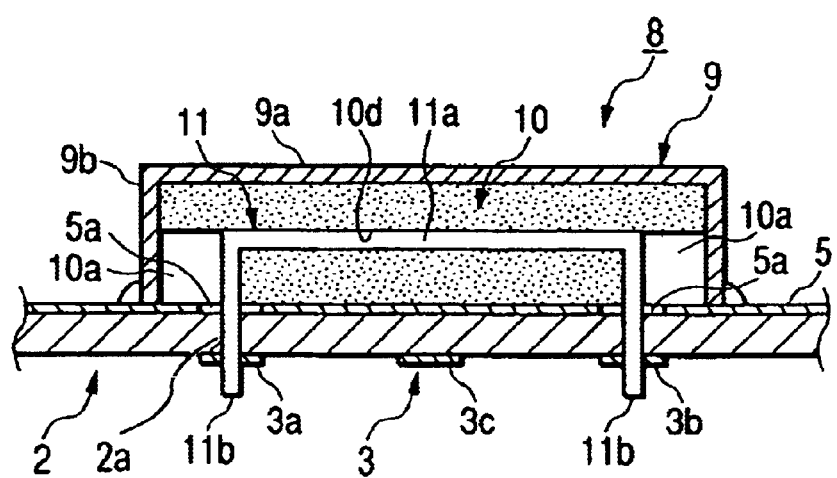
FIG. 4 is an enlarged sectional view illustrating a major part of the connection structure for an RF circuit of the first embodiment.
Figure 5:
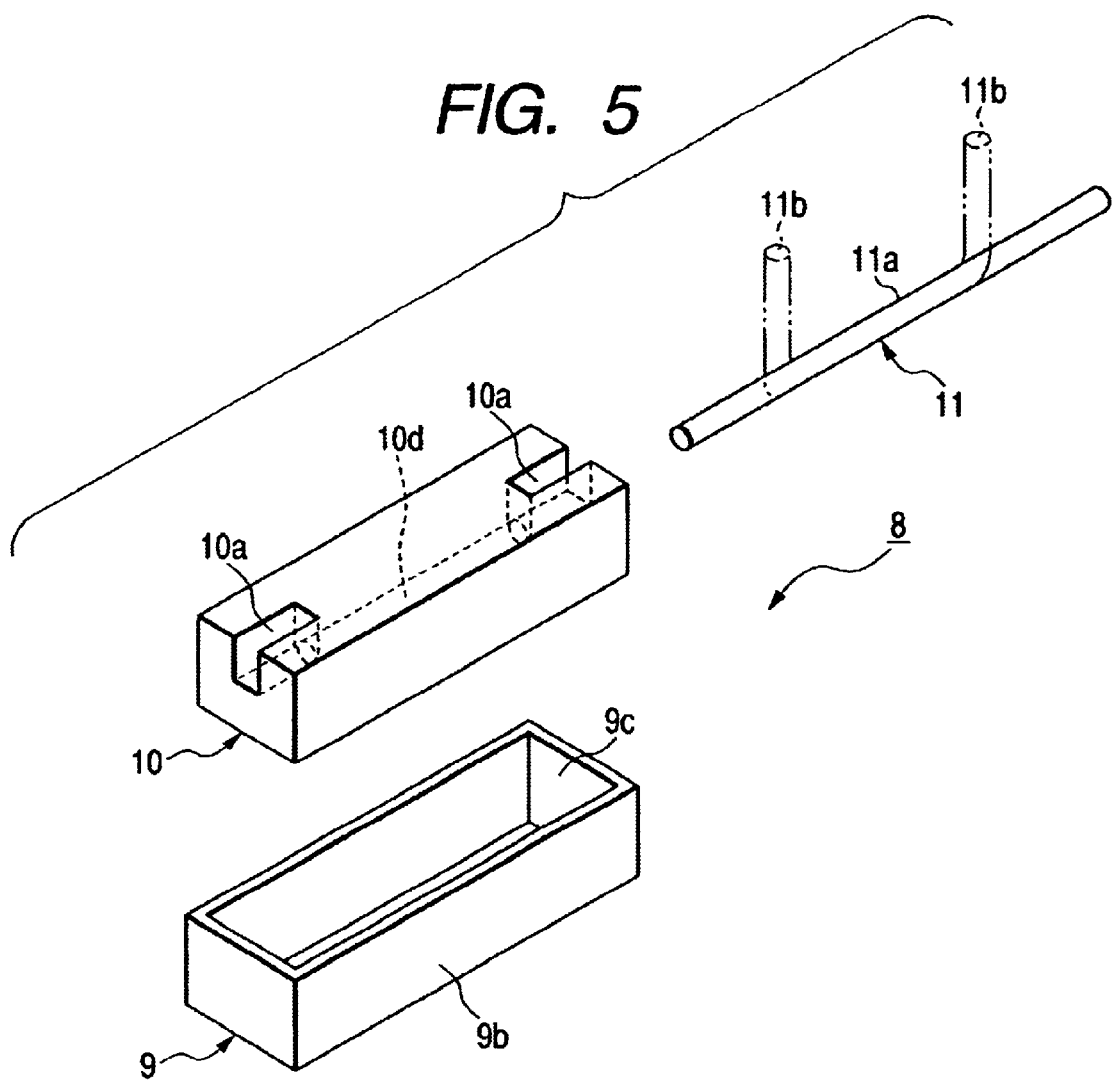
FIG. 5 is an exploded perspective view illustrating a jumper member of the connection structure for an RF circuit of the first embodiment, in which the jumper member is turned inside out.
Figure 6:
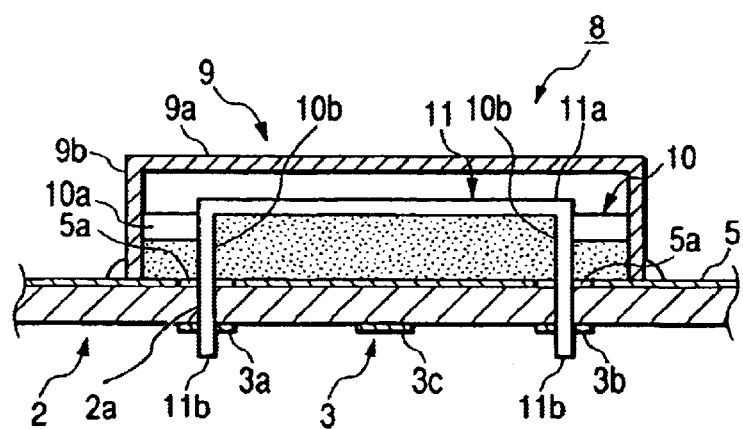
FIG. 6 is an enlarged sectional view illustrating a major part of the connection structure for an RF circuit of the second embodiment.

FIG. 4 is an enlarged sectional view illustrating a major part of the connection structure of the first embodiment; FIG. 5, an exploded perspective view illustrating a jumper member of the connection structure of the first embodiment, in which the jumper member is turned inside out; FIG. 6, an enlarged sectional view illustrating a major part of the connection structure of the second embodiment; and FIG. 7, an exploded perspective view illustrating a jumper member of the connection structure of the second embodiment.

Figure 8:
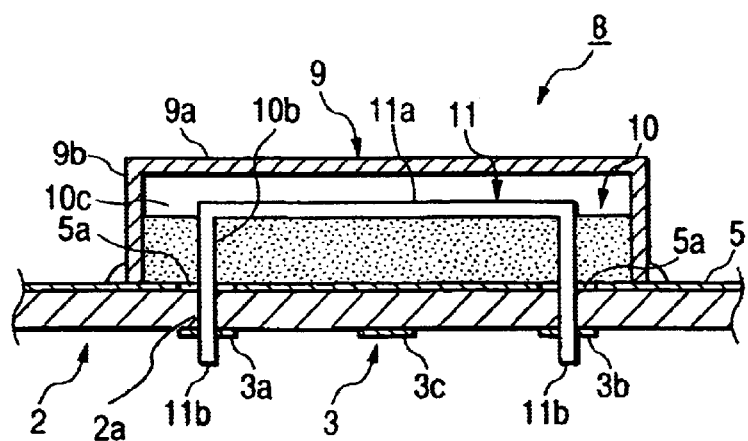
FIG. 8 is an enlarged sectional view illustrating a major part of the connection structure for an RF circuit of the third embodiment.
Figure 9:
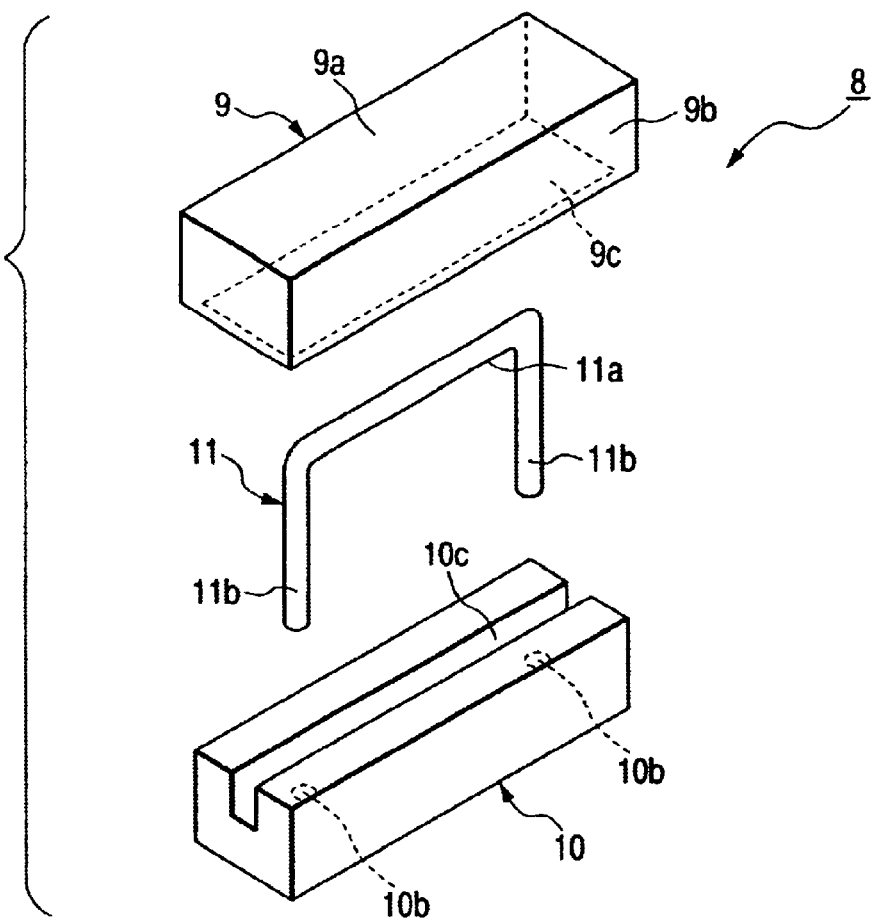
FIG. 9 is an exploded perspective view illustrating a jumper member of the connection structure for an RF circuit of the third embodiment.
Figure 10:
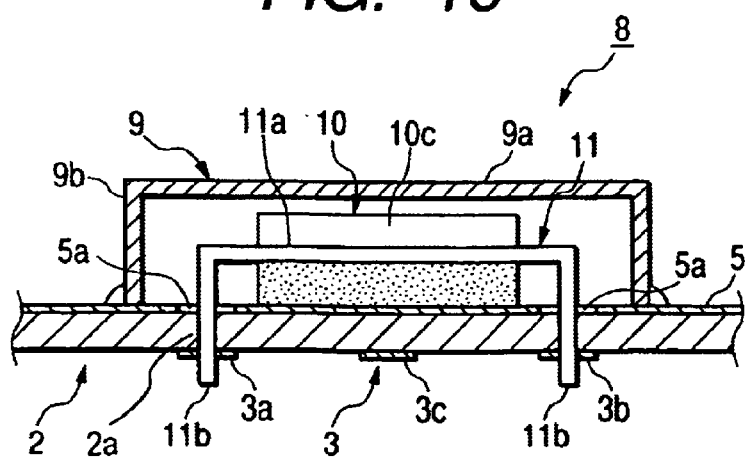
FIG. 10 is an enlarged sectional view illustrating a major part of the connection structure for an RF circuit of the fourth embodiment.

FIG. 8 is an enlarged sectional view illustrating a major part of the connection structure of the third embodiment; FIG. 9, an exploded perspective view illustrating a jumper member of the connection structure of the third embodiment; FIG. 10, an enlarged sectional view illustrating a major part of the connection structure of the fourth embodiment; FIG. 11, an enlarged sectional view illustrating a major part of the connection structure of the fifth embodiment; and FIG. 12, an enlarged sectional view illustrating a major part of the connection structure for an RF circuit of the sixth embodiment.

The construction of the connection structure for an RF circuit of the first embodiment will be described referring to FIG. 1 through FIG. 5, taking an example from a receiving converter for satellite broadcasting. The connection structure employs a frame 1 made of a metal plate, which is formed in a rectangle with the top and bottom opened.

A printed circuit board 2 is provided with a wiring pattern 3 on one side, and the wiring pattern 3 mounts various electric components 4 to form a desired RF circuit.

The wiring pattern 3 includes first and second conductors 3a, 3b that are located with a space in between, and a third conductor 3c that passes between the first and second conductors 3a, 3b.

A grounding pattern 5 for shielding is provided on all the other side of the circuit board 2. The grounding pattern 5 is also provided with removed parts 5a to surround holes 2a bored on the circuit board 2, each facing to the first and second conductors 3a, 3b.

The circuit board 2 having such a construction is attached to the frame 1, so as to close one open part of the rectangular frame 1.

Concretely, the circuit board 2 is attached to the frame 1 by soldering the grounding pattern 5 on the frame 1, in such a manner that the electric components 4 are located inside the frame 1, and the grounding pattern 5 is exposed outside the frame 1.

Thereby, the electric components 4 are electrically shielded.

Further, the other open part of the frame 1 is provided with a cover to close the open part, which is not illustrated here. This cover, the frame 1, and the circuit board 2 form an enclosure that shields the electric components 4.

An L-shaped feeder horn 6 is attached to the circuit board 2 to be located outside the frame 1, which is made capable of inputting the vertically polarized wave V and the horizontally polarized wave H. Two coaxial connectors 7 connected to the RF circuit are attached to the frame 1, and a desired signal is delivered through the coaxial connectors 7.

A jumper member 8 is made up with a boxed-shaped cover 9, an insulating base 10 contained in the cover 9, and a jumper line 11 positioned and retained by the insulating base 10, which is partially shielded by the cover 9.

The cover 9 is made of an inexpensive tin plate, which is easy to be soldered. The cover 9 is formed of a rectangular upper wall 9a, four side walls 9b bent down from the four sides of the upper wall 9a, and an open part 9c on the lower side.

The insulating base 10 made of an insulating material such as poly-tetra fluoro-ethylene is formed in a parallelepiped on, which has a pair of recesses 10a on both ends of the upper side in the longitudinal direction, and a longitudinal through hole 10d that connects the pair of recesses 10a on the bottom thereof. The insulating base 10 is contained inside the cover 9 before mounting.

Here, the lower side of the insulating base 10 is exposed from the open part 9c of the cover 9, which is flush with the lower part of the cover 9.

The jumper line 11 made of a copper wire or the like is formed in a U-shape, having a straight base part 11a and a pair of terminals 11b that are bent perpendicularly from both ends of the base part 11a. The straight base part 11a of the jumper line 11 is inserted through the through hole 10d of the insulating base 10 to be positioned and retained. The terminals 11b are bent along the side faces of the recesses 10a, and are retained by the insulating base 10 in a state that the terminals 11b protrude from the lower side of the insulating base 10 through the recesses 10a.

That is, the jumper line 11 is attached in a state that the U-shaped base part 11a embraces the insulating base 10, and the jumper line 11 attached to the insulating base 10 is contained in the cover 9 together with the insulating base 10.

When the jumper line 11 is contained in the cover 9, the base part 11a and part of the terminals 11b are shielded by the box-shaped cover 9, and the terminals 11b protrude outward from the lower side of the insulating base 10 and the open part 9c of the cover 9.

The jumper member 8 is assembled as shown in FIG. 5. First, the straight jumper line 11 is inserted through the through hole 10d, and then ends horizontally projected from the pair of recesses 10a are bent along the sides of the recesses 10a.

Thereby, the pair of terminals 11b are formed as shown by the dashed lines in FIG. 5.

Next, the insulating base 10 with the jumper line 11 attached in this manner is put to the open part 9c of the cover 9, and the insulating base 10 is put into the cover 9, and both are combined. Thus, the assembling of the jumper member 8 is completed.

The jumper member 8 thus assembled is placed on the external grounding pattern 5 of the circuit board 2, the lower end of the cover 9 is put in contact with the grounding pattern 5, and the whole lower end of the cover 9 is entirely soldered to the grounding pattern 5.

Thereby, the jumper line 11 is entirely surrounded by the grounding pattern 5 and the cover 9, which secures the electric shielding to the jumper line 11.

The pair of terminals 11b of the jumper line 11 are inserted through the holes 2a of the circuit board 2, and are soldered each on the first and second conductors 3a, 3b. The pair of terminals 11b are connected to the first and second conductors 3a, 3b in a state that the jumper line 11 intersects the third conductor 3c.

Next, an example of the RF circuit that needs the jumper member 8 having such a construction will be described referring to FIG. 2. The vertically polarized wave V and the horizontally polarized wave H supplied from the feeder horn 6 each pass through RF amplifiers 15, 16, and then they are split into the high frequency band and the low frequency band.

The high frequency band of the vertically polarized wave V and the high frequency band of the horizontally polarized wave H are each inputted to mixers 19, 20 through band pass filters 17, 18. In the same manner, the low frequency bands are also inputted to mixers 23, 24 through band pass filters 21, 22.

The band pass filters 17, 18 and the mixers 19, 20 for the high frequency band are laid out adjacent to each other, and a local oscillator 25 is connected to the mixers 19, 20, so that the mixers 19, 20 can share one local oscillator 25. The band pass filters 21, 22 and the mixers 23, 24 for the low frequency band are laid out adjacent to each other, and a local oscillator 26 is connected to the mixers 23, 24, so that the mixers 23, 24 can share one local oscillator 26.

Here, as shown in FIG. 2, the line connecting the band pass filter 17 for the high frequency band of the vertically polarized wave V intersects the line connecting the band pass filter 22 for the low frequency band of the horizontally polarized wave H.

In this example, the band pass filter 22 for the low frequency band of the horizontally polarized wave H is connected by the jumper member 8 (shown by the dotted line).

In consequence, the first and second conductors 3a, 3b of the wiring pattern 3 are provided on both the ends of the jumper member 8, and between the first and second conductors 3a, 3b is provided the third conductor 3c which is the line for the vertically polarized wave V.

Here, the third conductor may be used for the line connecting the band pass filter 22 for the low frequency band of the horizontally polarized wave H, and the band pass filter 17 for the high frequency band of the vertically polarized wave V may be connected by the jumper member 8. Or, the pattern may be designed such that the line connecting the band pass filter 21 for the low frequency band of the vertically polarized wave V intersects the line connecting the band pass filter 18 for the high frequency band of the horizontally polarized wave H, and the jumper member may be used in this part.

Figure 7:
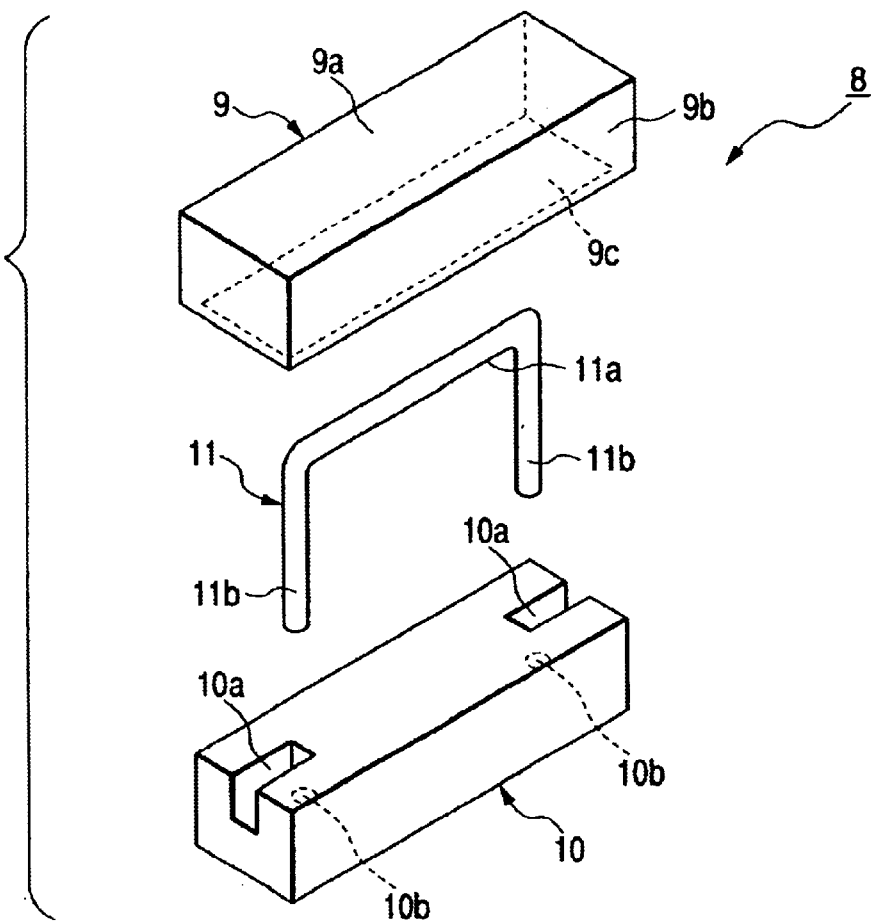
FIG. 7 is an exploded perspective view illustrating a jumper member of the connection structure for an RF circuit of the second embodiment.

Next, FIG. 6 and FIG. 7 illustrate the connection structure for an RF circuit of the second embodiment, and the construction thereof will be explained referring to these drawings. In the second embodiment, holes 10b are bored vertically through the insulating base 10 in replacement for the through hole 10d in the first embodiment.

The U-shaped jumper line 11 is positioned and retained in a state that the base part 11a is mounted on the upper part of the insulating base 10, by inserting the pair of terminals 11b through the holes 10b, and part of the terminals 11b are projected downward from the lower side of the insulating base 10.

The other construction is the same as that of the first embodiment, the same components are given the same numbers, and the descriptions thereof will be omitted here.

Next, FIG. 8 and FIG. 9 illustrate the connection structure for an RF circuit of the third embodiment, and the construction thereof will be explained referring to these drawings. The insulating base 10 is provided with a groove 10c formed along the longitudinal direction on the upperside thereof. The jumper line 11 is placed in a state that the straight base part 11a thereof is buried in the groove 10c, and is positioned by the groove 10c; and it is positioned and retained by inserting the pair of terminals 11b through the holes 10b, and the terminals 11b are partially projected downward from the lower side of the insulating base 10.

The other construction is the same as that of the second embodiment, the same components are given the same numbers, and the descriptions thereof will be omitted here.

Thus, burying the straight part of the base part 11a of the jumper line 11 in the groove 10c will facilitate insulating the jumper line 11 to the cover 9, and thereby the assembly of the jumper member 8 will become easy.

Next, FIG. 10 illustrates the connection structure for an RF circuit of the fourth embodiment, and the construction thereof will be explained referring to the drawing. The fourth embodiment eliminates the holes 10b, which are provided in the third embodiment. The insulating base 10 is provided with the groove 10c formed along the longitudinal direction on the upper side thereof. The jumper line 11 is placed in a state that the straight base part 11a thereof is buried in the groove 10c, and is positioned and retained by the groove 10c, so that the pair of terminals 11b are projected downward from both ends of the insulating base 10.

And, the insulating base 10 is mounted on the circuit board 2, and thereby the jumper line 11 is positioned, so that the cover 9 covers the insulating base 10 as well as the jumper line 11.

The other construction is the same as that of the third embodiment, the same components are given the same numbers, and the descriptions thereof will be omitted here.

Next, FIG. 11 illustrates the connection structure for an RF circuit of the fifth embodiment. In the fifth embodiment, by caulking or twisting the front ends of projections 9d that are projected through the circuit board 2 from the side walls 9b of the cover 9, the cover 9 is attached to the circuit board 2 in a state that the lower ends of the cover 9 are brought in contact with the grounding pattern 5.

The other construction is the same as that of the first embodiment, the same components are given the same numbers, and the descriptions thereof will be omitted here.

Next, FIG. 12 illustrates the connection structure for an RF circuit of the sixth embodiment. The sixth embodiment is provided with bends 9e that are formed by bending the side walls 9b of the cover 9 as well as with screws 12 that penetrate through the bends 9e and the circuit board 2. Nuts 13 screwed by the screws 12 fasten the cover 9 to the circuit board 2 in a state that the lower ends of the cover 9 are brought in contact with the grounding pattern 5.

The other construction is the same as that of the first embodiment, the same components are given the same numbers, and the descriptions thereof will be omitted here.

According to the invention, the connection structure for an RF circuit is provided with a circuit board that mounts electric components on a wiring pattern provided on one side thereof to form a desired RF circuit, a grounding pattern provided on the other side of the circuit board, and a jumper member provided on the other side of the circuit board. The jumper member is made up with a boxed-shaped cover with the lower side open, an insulating base contained inside the cover, and a jumper line of which both ends are projected downward from a lower side of the insulating base in a state that the jumper line is positioned by the insulating base. The jumper line has a base part that is positioned by the insulating base, and is placed inside the cover to be electrically shielded, and terminals projected downward from the lower side of insulating base. The wiring pattern includes first and second conductors and a third conductor that passes between the first and second conductors. As to the jumper member provided on the other side of the circuit board, the insulating base having positioned the jumper line is mounted on the circuit board. And, in a state that the jumper line intersects the third conductor, the terminals are inserted through the circuit board to be connected to the first and second conductors. And, the cover is attached to the circuit board in a state that the lower ends of the cover are put into contact with the grounding pattern.

Owing to this construction, the base part of the jumper line is contained inside the cover, so that the cover electrically shields the jumper line. Therefore, this construction provides the connection structure for an RF circuit that exceeds in the RF characteristics, in comparison to the conventional one.

Further, since it eliminates the molding of the jumper line, as is often the case with the conventional one, the construction provides an inexpensive connection structure for an RF circuit.

Further, the whole circumference of the cover is soldered to the grounding pattern. This construction secures the shielding of the jumper line, and this provides the connection structure for an RF circuit that furthermore exceeds in the RF characteristics.

Further, the jumper line has a straight base part and a pair of terminals that are bent from both ends of the base part. The insulating base has a longitudinal through hole, and the base part is inserted through the through hole, whereby the jumper line is positioned and retained. Thereby, the assembling of the jumper member becomes easy, which achieves high productivity in the jumper member. And, the jumper line can be mounted without molding it into the insulating base, which contributes lowering the production cost.

Further, the jumper line has a straight base part and a pair of terminals that are bent from both ends of the base part. The base part is placed in a groove provided on an upper part of the insulating base, whereby the jumper line is positioned. Thereby, the assembling of the jumper member becomes easy, which achieves high productivity in the jumper member. And, the jumper line can be mounted without molding it into the insulating base, which contributes lowering the production cost.

Further, the jumper line has a straight base part and a pair of terminals that are bent from both ends of the base part. The terminals are inserted through vertical holes provided on the insulating base, whereby the jumper line is positioned and retained. Thereby, the assembling of the jumper member becomes easy, which achieves high productivity in the jumper member. And, the jumper line can be mounted without molding it into the insulating base, which contributes lowering the production cost.

Further, the circuit board is attached to an open part provided to one side of a frame, the electric components are located inside the frame, and the grounding pattern and the jumper member are exposed outside the frame. Therefore, especially when it is used for one in which the jumper member is placed outside the frame, the construction provides a very suitable connection structure.

Further, a feeder horn is attached to the grounding pattern to be located outside the frame to form a receiving converter for satellite broadcasting. Therefore, especially when it is used for a receiving converter for satellite broadcasting, the construction provides a very suitable connection structure.

What is claimed is:

1. A connection structure for an RF circuit comprising
 a circuit board that mounts electric components on a wiring pattern provided on one side thereof to form a desired RF circuit, a grounding pattern provided on another side of the circuit board, and a jumper member provided on the other side of the circuit board, wherein the jumper member includes a boxed-shaped cover with a lower side open, an insulating base contained inside the cover, and a jumper line of which both ends are projected downward from a lower side of the insulating base in a state that the jumper line is positioned by the insulating base;
 wherein the jumper line includes a base part that is positioned by the insulating base, and is placed inside the cover to be electrically shielded, and terminals projected downward from the lower side of the insulating base;
 wherein the wiring pattern includes first and second conductors and a third conductor that passes between the first and second conductors; and
 wherein with regard to the jumper member provided on the other side of the circuit board, the insulating base having positioned the jumper line is mounted on the circuit board, the terminals are inserted through the circuit board to be connected to the first and second conductors in a state that the jumper line intersects the third conductor, and the cover is attached to the circuit board in a state that lower ends of the cover are put into contact with the grounding pattern.

2. The connection structure for an RF circuit according to claim 1, wherein a whole circumference of the cover is soldered to the grounding pattern.

3. The connection structure for an RF circuit according to claim 1, wherein the base part of the jumper line is straight and the terminals that are bent from both ends of the base part, wherein the insulating base has a longitudinal through hole, and wherein the base part is inserted through the through hole, whereby the jumper line is positioned and retained.

4. The connection structure for an RF circuit according to claim 1, wherein the base part of the jumper line is straight and the terminals are bent from both ends of the base part, and wherein the base part is placed in a groove provided on an upper part of the insulating base, whereby the jumper line is positioned.

5. The connection structure for an RF circuit according to claim 1, wherein the base part of the jumper line is straight and the terminals are bent from both ends of the base part, and wherein the terminals are inserted through vertical holes provided on the insulating base, whereby the jumper line is positioned and retained.

6. The connection structure for an RF circuit according to claim 1, wherein the circuit board is attached to an open part provided to one side of a frame, wherein the electric components are located inside the frame, and wherein the grounding pattern and the jumper member are exposed outside the frame.

7. The connection structure for an RF circuit according to claim 6, wherein a feeder horn is attached to the grounding pattern to be located outside the frame to form a receiving converter for satellite broadcasting.

* * * * *